(12) United States Patent
Zong et al.

(10) Patent No.: US 9,853,563 B2
(45) Date of Patent: Dec. 26, 2017

(54) ISOLATED SYNCHRONOUS RECTIFICATION CONTROL CIRCUIT, CONTROL DEVICE, AND CONTROL METHOD

(71) Applicant: SHENZHEN CHIP HOPE MICRO-ELECTRONICS LTD., Shenzhen (CN)

(72) Inventors: Qiang Zong, Wuxi (CN); Shouhua Wu, Wuxi (CN); Lei Guan, Wuxi (CN); Zhong Yin, Wuxi (CN)

(73) Assignee: SHENZHEN CHIP HOPE MICRO-ELECTRONICS LTD., Shenzhen (CN)

( * ) Notice: Subject to any disclaimer, the term of this patent is extended or adjusted under 35 U.S.C. 154(b) by 0 days.

(21) Appl. No.: 15/304,006

(22) PCT Filed: Feb. 2, 2016

(86) PCT No.: PCT/CN2016/073150
§ 371 (c)(1),
(2) Date: Oct. 13, 2016

(87) PCT Pub. No.: WO2017/067116
PCT Pub. Date: Apr. 27, 2017

(65) Prior Publication Data
US 2017/0272001 A1    Sep. 21, 2017

(30) Foreign Application Priority Data
Oct. 21, 2015   (CN) .......................... 2015 1 0681520

(51) Int. Cl.
*H02M 3/335*   (2006.01)
*H02M 7/217*   (2006.01)
(Continued)

(52) U.S. Cl.
CPC ............. *H02M 7/217* (2013.01); *H02M 1/36* (2013.01); *H03K 5/08* (2013.01); *H02M 3/33592* (2013.01); *H02M 2001/0009* (2013.01)

(58) Field of Classification Search
CPC ..... H02M 3/33592; H02M 2001/0009; H02M 7/217; H02M 1/36; H03K 5/08
See application file for complete search history.

(56) References Cited

U.S. PATENT DOCUMENTS

2010/0014324 A1* 1/2010 Yang ................. H02M 3/33592
                                                    363/21.06
2010/0327947 A1* 12/2010 Havanur ........... H02M 3/33592
                                                    327/434

FOREIGN PATENT DOCUMENTS

CN          102195492 A       9/2011
CN          102231605 A      11/2011
(Continued)

*Primary Examiner* — Jue Zhang
*Assistant Examiner* — Jye-June Lee
(74) *Attorney, Agent, or Firm* — Anova Law Group, PLLC

(57) ABSTRACT

The present invention provides an isolated synchronous rectification control circuit, a control device, and a control method. The control circuit includes a power supply module, a reference module, a comparator module, a primary side turn-on determination unit, a secondary intermittent burst estimation unit, a logic unit, and a driver unit. The control device includes a transformer, a bypass capacitor configured to provide a stable voltage, a time constant setting resistor configured to configure a primary side turn-on time constant and a secondary intermittent burst time estimation determination, a synchronous rectification control circuit configured to determine the primary side turn-on based on the current flowing into a time setting terminal, predict a secondary side intermittent burst time, and generate logic control signals to (Continued)

drive the turn-on or turn-off of the synchronous rectifier, and an output capacitor connected to the rectification control circuit to provide an output capacitance.

16 Claims, 4 Drawing Sheets

(51) Int. Cl.
*H03K 5/08* (2006.01)
*H02M 1/36* (2007.01)
*H02M 1/00* (2006.01)

(56) References Cited

FOREIGN PATENT DOCUMENTS

| | | |
|---|---|---|
| CN | 104009655 A | 8/2014 |
| EP | 2493063 B1 | 7/2014 |
| JP | 3262112 B2 | 3/2002 |
| JP | 2009284667 A | 12/2009 |

\* cited by examiner

ISOLATED SYNCHRONOUS RECTIFICATION CONTROL CIRCUIT, CONTROL DEVICE, AND CONTROL METHOD

CROSS-REFERENCES TO RELATED APPLICATIONS

This application is a national stage application of PCT application PCT/CN2016/073150, filed on Feb. 2, 2016, which claims priority to and benefits of Chinese Patent Application No. 201510681520.8, filed with the State Intellectual Property Office of P. R. China on Oct. 21, 2015. The entire contents of all of which are incorporated herein by reference.

FIELD OF THE DISCLOSURE

The present disclosure generally relates to the synchronous rectification control circuit technology and, more particularly, relates to an isolated synchronous rectification control circuit, a device and a control method.

BACKGROUND

Currently, the main purpose of isolated synchronous rectification is to replace secondary side Schottky rectifier for low output voltage and large output current applications to achieve higher efficiency, smaller foot print, and lower system cost. Low conduction voltage drop Schottky rectifier has a forward conduction voltage drop at about 0.2V to 0.3V while synchronous rectifier has a conduction voltage drop about less than 0.15V under the circumstance of reasonable design. Such synchronous rectifier may substantially reduce the rectification power loss and improve system efficiency.

FIG. 1 illustrates a schematic diagram of a conventional synchronous rectification control device. The synchronous rectification control device includes a transformer 101, a synchronous rectifier 102, an output capacitor 103, a VCC power supply resistor 104, a VCC bypass capacitor 105, a time constant setting resistor 108, another time constant setting resistor 107, and a synchronous rectification control chip 106. Because the resistor network jointly formed by the time constant setting resistor 108 and the time constant setting resistor 107 makes the primary side turn-on decision, the synchronous rectification control chip 106 determines the turn-on of the primary side power transistor by integrating the signals of DET pin and AE pin. The VCC pin supplies power to the chip.

However, the control mechanism described above is complex and requires many components. The power supply by the VCC pin comes from the output voltage Vout. When the entire control system operates in a low output voltage mode, the VCC may not supply sufficient power, causing the malfunction of the synchronous rectification control chip 106. The rectification function may only be supported by a parasitic body diode of the rectifier, causing excessive heat and loss of efficiency.

FIG. 2 illustrates a schematic diagram of another conventional synchronous rectification control device. The synchronous rectification control device includes a transformer 201, an output capacitor 202, a VCC bypass capacitor 203, a synchronous rectification driving chip 204, and a filtering capacitor 205. This type of control structure totally depends on voltage determination to control the turn-on and turn-off of the synchronous rectifier. The lack of primary side turn-on recognition mechanism may easily cause erroneous operation of the synchronous rectifier and potential device explosion symptom.

Therefore, the conventional synchronous rectification control circuits are unable to operate properly under the circumstances of complex system, lacking dual voltage determination mechanism, and inefficient.

BRIEF SUMMARY OF THE DISCLOSURE

The present invention solves the technical problems by overcoming the deficiencies of the conventional technologies. The present invention provides an isolated synchronous rectification control circuit, a control device, and a control method to solve the problem of lacking a primary side turn-on recognition mechanism in the conventional synchronous rectification control circuit, which often causes erroneous operation or severe heat build-up and loses efficiency of the synchronous rectifier.

Specifically, the present invention uses the following technical solution to solve the technical problem described above.

An isolated synchronous rectification control circuit includes:
  a power supply module, configured to supply a voltage;
  a reference module, configured to generate at least a first and a second reference source;
  a comparator module, including a turn-on comparator configured to compare a voltage at a voltage terminal of the control circuit against the first reference source and a first turn-off comparator configured to compare the voltage at the voltage terminal of the control circuit against the second reference source;
  a primary side turn-on determination unit, configured to obtain an integral value of a current flowing into a time setting terminal of the control circuit and compare the integral value of the current against a pre-configured value;
  a secondary intermittent burst estimation unit, configured to predict a time required for turning on a synchronous rectifier based on the integral value of the current obtained by the primary side turn-on determination unit, to provide a shielding time based on the predicted time for turning on the synchronous rectifier, and to compare the shielding time against an actual time for turning on the synchronous rectifier;
  a logic unit, configured to generate logic control signals for turning the synchronous rectifier based on the comparison results from the turn-on comparator and the primary side turn-on determination unit, and logic control signals for turning off the synchronous rectifier based on the comparison results from the first turn-off comparator and the secondary side intermittent burst estimation unit; and
  a driver unit, configured to drive the synchronous rectifier based on the logic control signals generated by the logic unit.

Further, as a preferred technical solution of the present invention, the comparator module also includes a second turn-off comparator configured to compare the voltage at the voltage terminal of the control circuit against a third reference source generated by the reference module.

Further, as a preferred technical solution of the present invention, the isolated synchronous rectification control circuit also includes a clamp circuit configured to prevent erroneous turn-on of the synchronous rectifier.

Further, as a preferred technical solution of the present invention, the primary side turn-on determination unit includes an integrating capacitor, a first current mirror composed of two NMOS transistors, a second current mirror composed of two PMOS transistors, a comparator unit, and a pull-down NMOS transistor. The reference module generates a first reference voltage. When the time setting terminal of the control circuit has a high voltage, the first current mirror is configured to produce a current to charge the integrating capacitor through the second current mirror. The comparator unit is configured to compare the voltage of the integrating capacitor against the first reference voltage and output a voltage signal based on the comparison result. The pull-down NMOS transistor is configured to discharge the voltage of the integrating capacitor at the end of each turn-on period.

Further, as a preferred technical solution of the present invention, the secondary side intermittent burst estimation unit circuit includes an NPN transistor, a third current mirror composed of two PMOS transistors, a fourth current mirror composed of two NMOS transistors, and a comparator unit. The reference module generates a second reference voltage. The NPN transistor is configured to achieve clamping zero. When the time setting terminal of the control circuit has a low voltage, the third current mirror is configured to produce a current to discharge the integrating capacitor through the fourth current mirror. The comparator unit is configured to compare the voltage of the integrating capacitor against the second reference voltage and output a voltage signal based on the comparison result.

Further, as a preferred technical solution of the present invention, the power supply module includes a start-up circuit, a modulation resistor, a high voltage PMOS transistor, two voltage divider resistors, an operational amplifier circuit, and a high voltage NMOS transistor. The start-up circuit is configured to produce a current when the voltage terminal of the control circuit has a high voltage. The modulation resistor is configured to produce a voltage. The high voltage PMOS transistor is configured to receive a voltage to be turned on. When the voltage at the voltage terminal of the control circuit reaches a start-up voltage, the operational amplifier circuit is configured to compare the voltage of the two voltage divider resistors against the reference voltage, and control to turn off the high voltage NMOS transistor based on the comparison result.

Further, as a preferred technical solution of the present invention, the power supply module further includes a NPN transistor configured to prevent a backward current flow from the power supply terminal to the voltage terminal of the control circuit.

The present invention also provides a control device incorporating the isolated synchronous rectification control circuit described above. The control device includes:

a transformer, wherein one end of the secondary output winding is connected to a ground terminal of the synchronous rectification control circuit and a bypass capacitor and the other end of the secondary output winding is connected to the ground;

a bypass capacitor, connected to a power supply terminal of the synchronous rectification control circuit to provide a stable voltage for the synchronous rectification control circuit;

a time constant setting resistor, connected to a time setting terminal of the synchronous rectification control circuit to configure a primary side turn-on time constant and a secondary intermittent burst time estimation determination;

a synchronous rectification control circuit, configured to determine the primary side turn-on based on the current flowing into a time setting terminal, to predict a secondary side intermittent burst time, and to generate logic control signals to drive the turn-on or turn-off of the synchronous rectifier based on the determination and prediction results; and an output capacitor, connected to a voltage terminal of the rectification control circuit to provide an output capacitance.

The present invention also provides an isolated synchronous rectification control method. The control method includes:

setting a primary side turn-on time constant and obtaining an integral value of the current flowing into a synchronous rectification control circuit;

comparing the integral value of the current against a pre-configured value and controlling the turn-on of a synchronous rectifier based on a comparison result of a voltage of the synchronous rectification control circuit and a reference source;

predicting a time required for turning on the synchronous rectifier based on the integral value of the current and providing a shielding time based on the predicted time for turning on the synchronous rectifier; and when an actual time for turning on the synchronous rectifier exceeds the shielding time and the voltage of the synchronous rectification control circuit is greater than the reference source, controlling to turn off the synchronous rectifier.

Further, as a preferred technical solution of the present invention, the time required for turning on the synchronous rectifier is obtained by estimating a negative voltage difference between the time setting terminal and the output ground terminal of the synchronous rectification control circuit during the secondary side continuous current flow.

The technical solutions according to the present invention provide the following technical effects.

(1). The present invention provides the isolated synchronous rectification control circuit, the control device, and the control method to prevent undesired turn-on of the synchronous rectifier by the primary side turn-on determination method and undesired turn-off of synchronous rectifier by the secondary side continuous current flow estimation method. The optimized VCC power supply circuit is used to ensure the power supply system to provide sufficient power supply under various operation modes. At the same time, the present invention uses the precision primary side turn-on determination circuit, the secondary side continuous current flow time estimation circuit, and dual voltage determination mechanism to ensure the proper operation of the synchronous rectifier under complex system conditions.

DETAILED DESCRIPTION

The present disclosure is further described in detail with accompanying drawings and exemplary embodiments.

Figure 1:
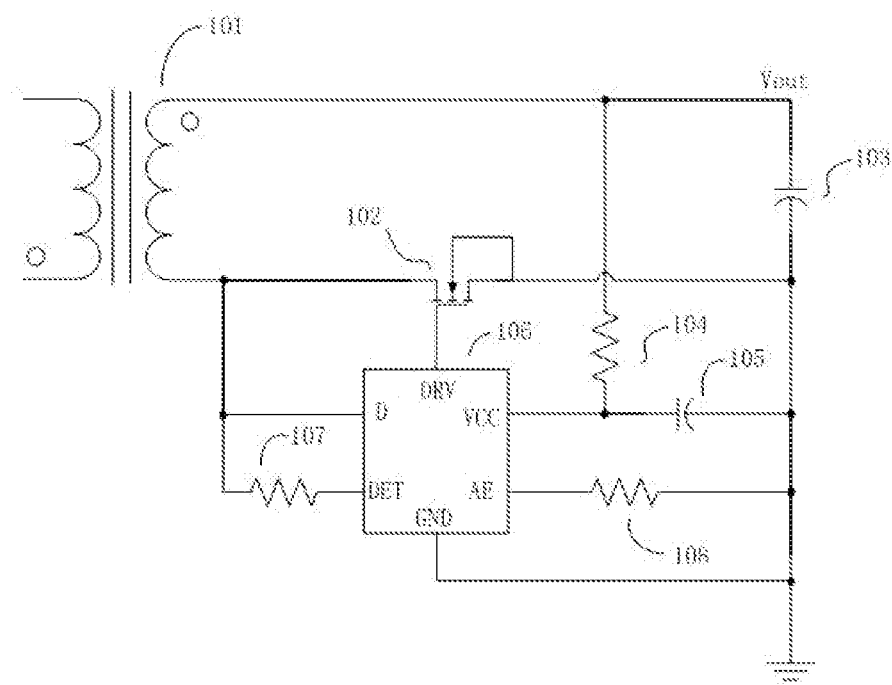
FIG. 1 illustrates a schematic diagram of a conventional synchronous rectification control device.
Figure 2:
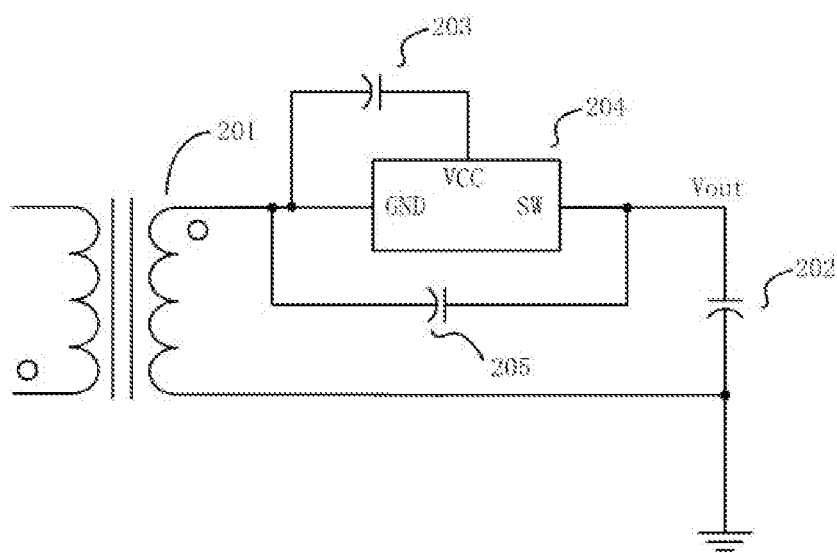
FIG. 2 illustrates a schematic diagram of another conventional synchronous rectification control device.
Figure 3:
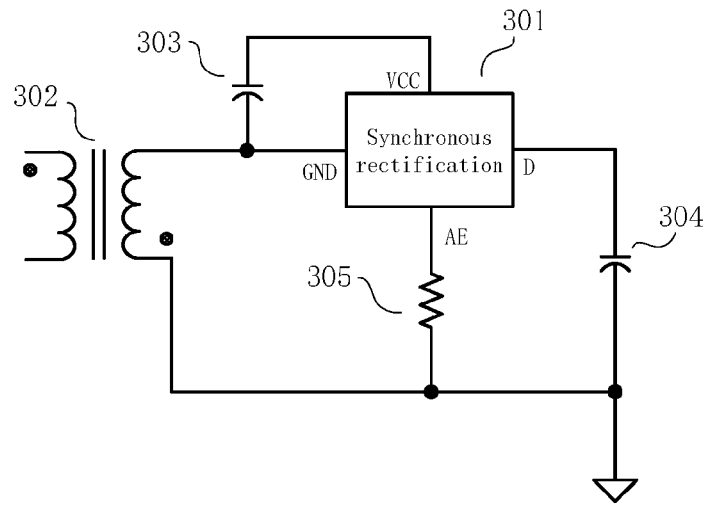
FIG. 3 illustrates a schematic diagram of an exemplary isolated synchronous rectification control device according to the disclosed embodiments.

As shown in FIG. 3, the present disclosure designs an isolated synchronous rectification control device. The device mainly includes a synchronous rectifier control circuit 301, a transformer 302, a bypass capacitor 303, an output resistor 304, and a time constant setting resistor 305, where the synchronous rectification control circuit includes a grounding terminal GND, a power supply terminal VCC, a time constant setting terminal AE, and a voltage terminal D. The not-dot end of the secondary output winding of the transformer 302 is connected to a grounding terminal GND of the synchronous rectification control circuit 301 and a terminal of the bypass capacitor 303. The dot end of the secondary output winding of the transformer 302 is connected to the ground. The other terminal of the bypass capacitor 303 is connected to a power supply terminal VCC of the synchronous rectification control circuit 301. A time setting terminal AE of the synchronous rectification control circuit 301 is connected to the ground through the time constant setting resistor 305. A voltage terminal D of the synchronous rectification control circuit 301 is connected to the ground through the output capacitor 304. When the synchronous rectification control circuit is in operation, the bypass capacitor 303 stabilizes the power supply voltage. The time constant setting resistor 305 is used to configure a time constant for a primary side turn-on circuit inside the synchronous rectification control circuit 301 and a determination for a secondary side intermittent burst time estimation circuit inside the synchronous rectification control circuit 301. The synchronous rectification control circuit 301 is used to determine whether to turn on the primary side based on the current received from the time setting terminal and, at the same time, to estimate secondary side intermittent burst time. The result of the determination and estimation is used to generate logic control signals to turn on or turn off the synchronous rectifier. Connected to the voltage terminal of the synchronous rectification control circuit 301, the output capacitor 305 is used to provide an output capacitance.

Figure 4:
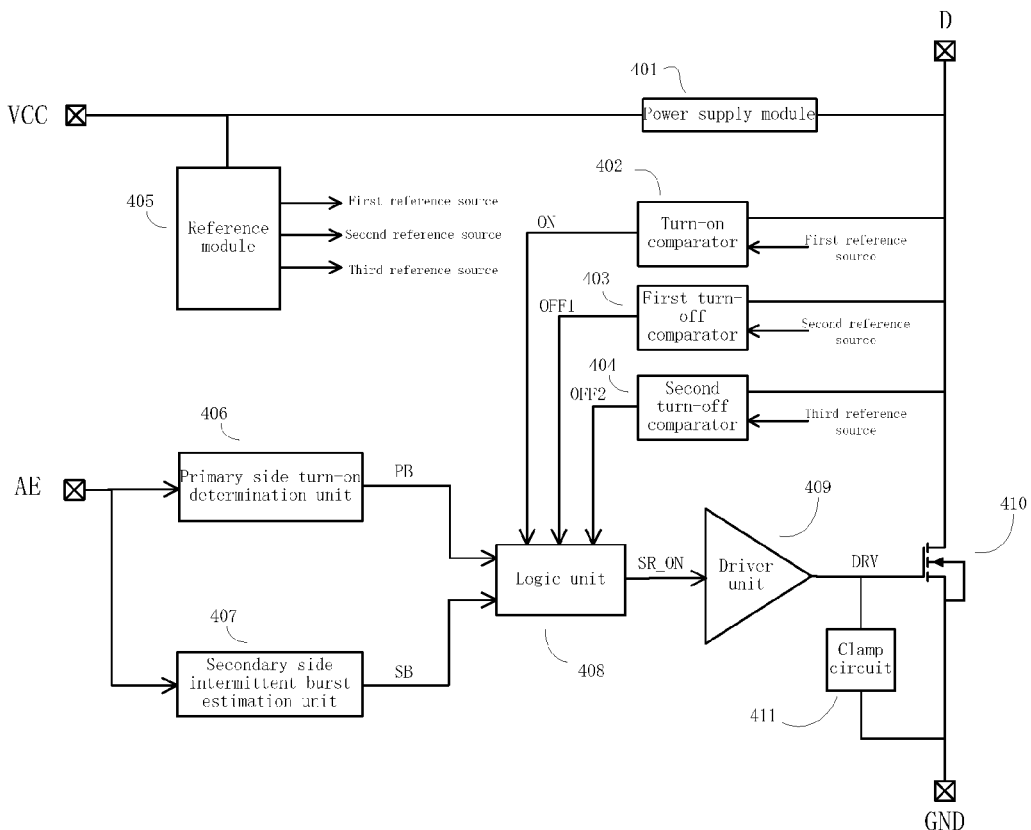
FIG. 4 illustrates a schematic diagram of another exemplary isolated synchronous rectification control circuit according to the disclosed embodiments.

The present invention provides a specific embodiment of the synchronous rectification control circuit 301. But the synchronous rectification control circuit 301 is not limited to this specific embodiment. As shown in FIG. 4, the synchronous rectification control circuit includes a power supply module 401, a reference module 405, a comparator module composed of a turn-on comparator 402 and a first turn-off comparator 403, a primary side turn-on determination unit 406, a secondary side intermittent burst estimation unit 407, a logic unit 408, a driver unit 409, and a synchronous rectifier 410. A terminal of the power supply module 401 is connected to a drain electrode of the synchronous rectifier 410 and a voltage terminal D of the control circuit. Another terminal of the power supply module 401 is connected to a power supply terminal VCC of the control circuit to provide a voltage. The reference module 405 is connected to the power supply terminal VCC of the control circuit to generate at least a first reference source and a second reference source. Input terminals of the comparator module are connected to the drain electrode of the synchronous rectifier 410 and the reference module 405. Output terminals of the comparator module are connected to input terminals of the logic unit 408. The turn-on comparator 402 is used to compare the voltage at the voltage terminal D of the control circuit with the first reference source. The first turn-off comparator 403 is used to compare the voltage at the voltage terminal D of the control circuit with the second reference source. An input terminal of the primary side turn-on determination unit 406 is connected to the time setting terminal AE of the control circuit and an output terminal of the primary side turn-on determination unit 406 is connected to an input terminal of the logic unit 408, configured to obtain the integral value of the current based on the current received from the time setting terminal AE of the control circuit and to compare the integral value of the current with a pre-configured value. An input terminal of the secondary side intermittent burst estimation unit 407 is connected to the time setting terminal AE of the control circuit and an output terminal of the secondary side intermittent burst estimation unit 407 is connected to another input terminal of the logic unit 408, configured to predict a time required for turning on the synchronous rectifier 410 based on the integral value of the current obtained by the primary side turn-on determination unit 407, provide a shielding time based on the predicted time required for turning on the synchronous rectifier 410, and compare the shielding time with actual time for turning on the synchronous rectifier 410. An output terminal of the logic unit 408 is connected to an input terminal of the driver unit 409, configured to generate logic control signals for turn-on or turn-off based on comparator outputs. An output terminal of the driver unit 409 is connected to the gate electrode of the synchronous rectifier 410 and the gate electrode of the synchronous rectifier 410 is connected to the grounding terminal GND of the control circuit. The driver unit 409 is used to drive the synchronous rectifier 410 based on the logic control signals for turn-on or turn-off generated by the logic unit 408.

When the primary side controller initializes, a high voltage that appears at the voltage terminal D of the synchronous rectification control circuit as shown in FIG. 4 may turn into a stable voltage at the power supply terminal VCC by the power supply module 401. When the primary side controller turns on, a current flows through the time constant setting resistor 305 as shown in FIG. 3 between the time setting terminal AE of the circuit and the ground terminal as shown in FIG. 3, and enters into the primary side turn-on determination unit 406 to obtain an integral value of the current. When the integral value of the current exceeds a pre-configured value and the voltage at the voltage terminal D of the control circuit is less than the first reference source, the logic unit 408 generates logic control signals to turn on the synchronous rectifier 410 through the driver unit 409. The secondary intermittent burst estimation unit 407 is used to predict a time Tp required for turning on the synchronous rectifier 410 and provide a shielding time based on the predicted time Tp for turning on the synchronous rectifier 410. When the actual time for turning on the synchronous rectifier 410 exceeds the provided shielding time and the voltage at the voltage terminal D of the control circuit is greater than the second reference source, the logic unit 408 generates the logic control signals to turn off the synchronous rectifier 410 through the driver unit 409.

Further, the comparator module also includes a second turn-off comparator 404 and the reference module 405 also generates a third reference source. Similarly, input terminals of the second turn-off comparator 404 are connected to the drain electrode of the synchronous rectifier 410 and the reference module 405, respectively. An output terminal of the second turn-off comparator 404 is connected to another input terminal of the logic unit 408. The second turn-off comparator unit 404 is used to trigger the logic unit 408 to generate the logic control signals to directly turn off the synchronous rectifier 410 through the driver unit 409 when the voltage at the voltage terminal D of the control circuit is greater than the third reference source during the time Tp required for turning on the synchronous rectifier 410.

In order to prevent undesired turn-on of the synchronous rectifier 410 due to the parasitic capacitance during the power on period, the synchronous rectification control circuit may further include a clamp circuit 411. One end of the clamp circuit 411 is connected to the gate electrode of the synchronous rectifier 410. The other end of the clamp circuit 411 is connected to the ground terminal of the synchronous rectification control circuit. Thus, the undesired turn-on of the synchronous rectifier 410 is avoided.

Figure 5:
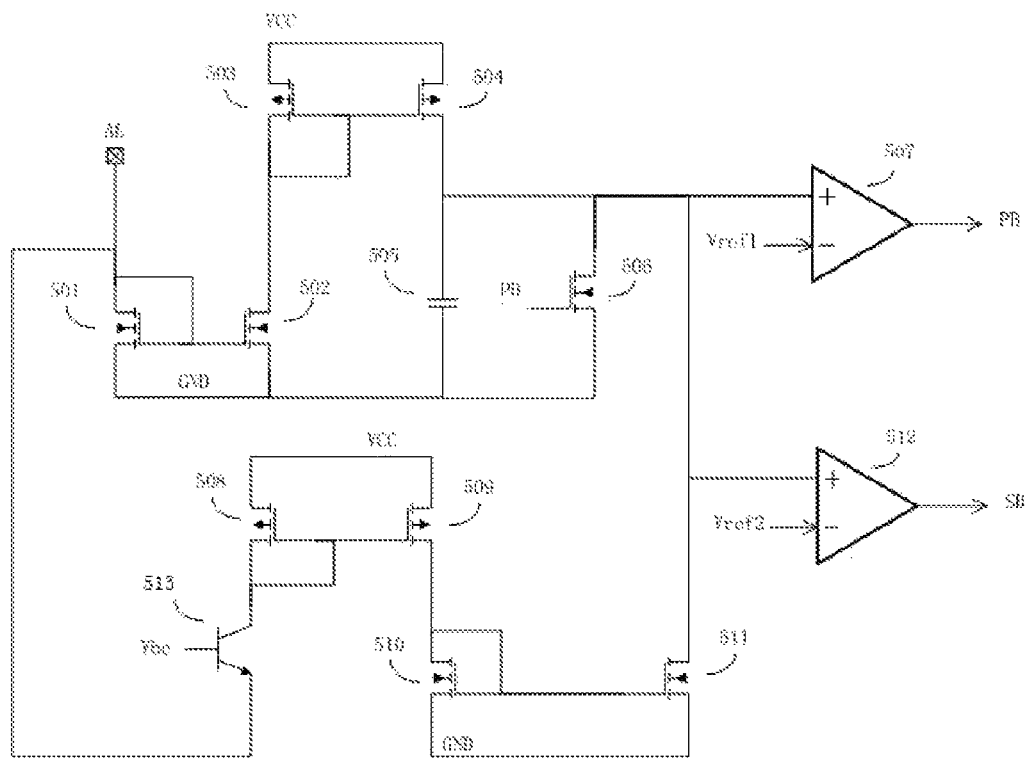
FIG. 5 illustrates a schematic diagram of an exemplary primary side opening determination unit and an exemplary secondary side switching estimation unit according to the disclosed embodiments.

The present invention also provides specific embodiments for the primary side turn-on determination unit and the secondary side intermittent burst estimation unit in the control circuit. But they are not limited to the described embodiments. In the circuit as shown in FIG. 5, the primary side turn-on determination unit includes a first current mirror composed of NMOS transistors 501 and 502, a second current mirror composed of PMOS transistors 503 and 504, an integrating capacitor 505, a pull-down NMOS transistor 506, and a comparator unit 507. An input terminal of the first current mirror is connected to the time setting terminal AE of the control circuit. An output terminal of the first current mirror is connected to an input terminal of the second current mirror. An output terminal of the second current mirror is connected to one end of the integrating capacitor 505 and a first input terminal of the comparator unit 507. The other end of the integrating capacitor 505 is connected to the ground terminal GND of the control circuit. The pull-down NMOS transistor 506 is connected in parallel to both ends of the integrating capacitor 505. A second input terminal of the comparator unit 507 is connected to the reference module, and particularly to the first reference voltage generated by the reference module. When the primary side switching transistor is turned on, the time setting terminal AE of the control circuit has a high voltage. The first current mirror composed of NMOS transistors 501 and 502 starts to produce a current to charge the integrating capacitor 505 through the second current mirror. The comparator unit 507 compares a voltage of the integrating capacitor 505 against the first reference voltage Vref1 generated by the reference module. When the voltage of the integrating capacitor 505 is greater than the first reference voltage Vref1, the comparator unit 507 outputs a high level signal PB. At this moment, the primary side switching transistor is turned on. The pull-down NMOS transistor 506 is used to discharge the voltage of the integrating capacitor 505 at the end of each turn-on period. The turn-on period is the duration that the synchronous rectifier is turned on.

As shown in FIG. 5, the secondary side intermittent burst estimation unit mainly includes a third current mirror composed of PMOS transistors 508 and 509, a fourth current mirror composed of NMOS transistors 510 and 511, a comparator unit 512, and an NPN transistor 513. The emitter of the NPN transistor 513 is connected to the time setting terminal AE of the control circuit. The collector of the NPN transistor 513 is connected to an input terminal of the third current mirror. An output terminal of the third current mirror is connected to an input terminal of the fourth current mirror. An output terminal of the fourth current mirror is connected to a first input terminal of the comparator unit 512 and the integrating capacitor 505. A second input terminal of the comparator unit 512 is connected to the reference module, and particularly to the second reference voltage generated by the reference module. When the synchronous rectifier is turned on, the time setting terminal AE of the control circuit has a low voltage. Clamping zero is achieved by the NPN transistor 513. At this moment, the third current mirror composed of the PMOS transistors 508 and 609 starts to produce a current to discharge the integrating capacitor 505 through the fourth current mirror composed of the NMOS transistors 510 and 511. The comparator unit 512 compares the voltage of the integrating capacitor 505 against the second reference voltage Vref2 generated by the reference module. When the voltage of the integrating capacitor 505 is less than the second reference voltage Vref2, the comparator unit 512 outputs a low level signal SB. The control circuit confirms that the secondary side intermittent time has approached the actual intermittent time. At this moment, the synchronous rectifier is turned off when the voltage at the voltage terminal D of the control circuit is greater than the second reference source.

Figure 6:
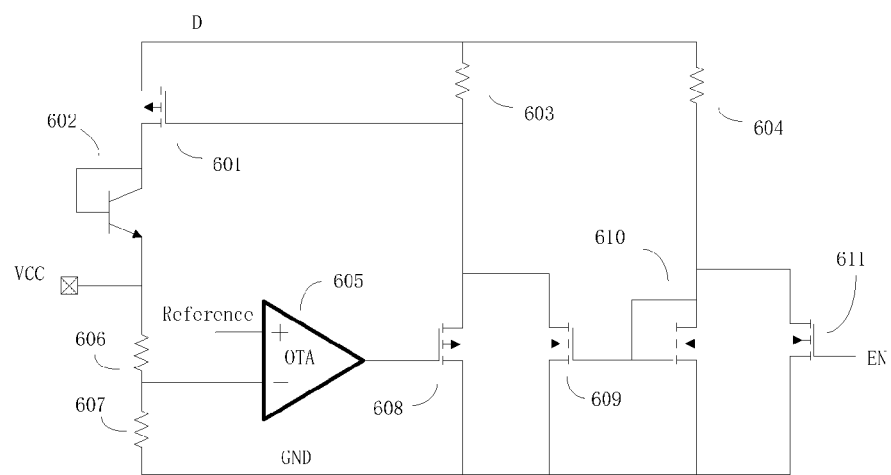
FIG. 6 illustrates a circuit diagram of an exemplary power supply module according to the disclosed embodiments.

The present invention also provides a specific embodiment for the power supply module. But it is not limited to this specific embodiment. As shown in FIG. 6, the power supply module includes a high voltage PMOS transistor 601, an NPN transistor 602, a modulation resistor 603, a start-up resistor 604, an operational amplifier circuit 605, voltage divider resistors 606 and 607, a high voltage NMOS transistor 608, NMOS transistors 609 and 610, and a pull-down transistor 611. The start-up resistor 604, the NMOS transistors 609 and 610, and the pull-down transistor 611 together form a start-up circuit. In the start-up circuit, the NMOS transistors 609 and 610 form a fifth current mirror. When the voltage terminal D of the control circuit has a high voltage, a terminal EN of the start-up circuit has a low level signal before the circuit is powered up. Through the pull-down circuit of the NMOS transistor 609, the circuit composed of the start-up resistor 604 and the NMOS transistor 610 produces a current that generates a voltage across the modulation resistor 603 to turn on the high voltage PMOS transistor 601. When the voltage at the power supply terminal VCC of the control circuit reaches a start-up voltage, the terminal EN of the start-up circuit has a high level signal to turn on the NMOS transistor 611 and prevent the NMOS transistor 609 from pulling down the current. At this moment, the voltage at the power supply terminal of the control circuit is divided by the divider resistor network composed of divider resistors 606 and 607. Then the divided voltage is compared against the reference voltage generated by the reference module. When the voltage at the power supply terminal VCC of the control circuit exceeds a preconfigured value, the operational amplifier 605 outputs low voltage signal to turn off the high voltage NMOS transistor 608, causing an absence of voltage drop across the modulation resistor 603 and the turn-off of the high voltage PMOS transistor 601. Thus, a stable voltage output at the power supply terminal VCC of the control circuit is achieved. The NPN transistor 602 is connected in a diode configuration to prevent a backward current flow from the power supply terminal VCC to the voltage terminal D of the control circuit.

Figure 7:
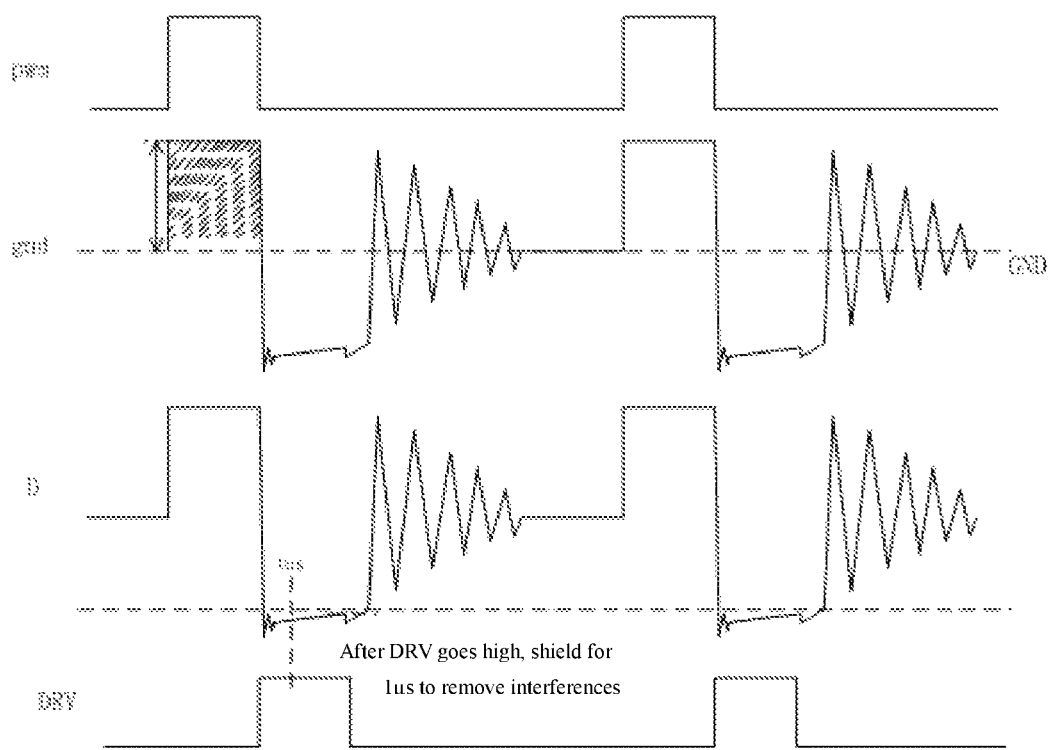
FIG. 7 illustrates a waveform diagram of various signals according to the disclosed embodiments.

The isolated synchronous rectification control circuit and device according to the present disclosure may obtain waveforms as shown in FIG. 7. The pwm signal is a driving signal for the primary side power transistor. The gnd signal is a waveform at the secondary side output ground with reference to the ground terminal GND of the synchronous rectification control circuit. The integral area of the shaded portion of the gnd signal greater than a pre-configured value is a necessary condition for turning on the synchronous rectifier, preventing any erroneous decision in the presence of DCM interference. The D signal is a waveform at the drain electrode of the synchronous rectifier with reference to the ground terminal GND of the synchronous rectification control circuit. The DRV signal is a driving signal for the synchronous rectifier as shown in FIG. 4.

The present invention also provides an isolated synchronous rectification control method. The method may be used in the isolated synchronous rectification control circuit and device according the present disclosure. Specifically, the method includes the following steps. Setting a primary side turn-on time constant and obtaining an integral value of the current flowing into the control circuit. Comparing the integral value against a pre-configured value. Controlling the turn-on of the synchronous rectifier based on the comparison between the voltage of the control circuit and the reference source. When the voltage of the control circuit is less than the reference source, controlling to turn on the synchronous rectifier.

Predicting a time required for turning on the synchronous rectifier based on the integral value of the current and providing a shielding time based on the predicted time required for turning on the synchronous rectifier. When the actual time for turning on the synchronous rectifier exceeds the shielding time and the voltage of the control circuit is greater than the reference source, controlling to turn off the synchronous rectifier.

Preferably, in the above method, the time constant of the primary side turn-on may be configured by adjusting the time setting resistor connecting between the time setting terminal and the output ground terminal of the synchronous rectification control circuit such that the determination criteria for the primary side turn-on may be adjusted accordingly. The time required for turning on the synchronous rectifier may be obtained by estimating a negative voltage difference between the time setting terminal and the output ground terminal of the synchronous rectification control circuit during the secondary side continuous current flow.

The present invention uses the precision primary side turn-on determination circuit, the secondary side continuous current flow time estimation circuit, and dual voltage determination mechanism to ensure the proper operation of the synchronous rectifier under complex system conditions.

Accompanying by the drawings, various embodiments of the present invention have been described in detail. However, the present invention is not limited to the embodiments described above. Within the knowledge of those having ordinary skills in the art, various changes and modifications may be made without departing from the scope of the present invention.

What is claimed is:

1. An isolated synchronous rectification control circuit, comprising:
   a power supply module configured to supply a voltage;
   a reference module configured to generate at least a first and a second reference source;
   a comparator module including a turn-on comparator configured to compare a voltage at a voltage terminal of the control circuit against the first reference source and a first turn-off comparator configured to compare the voltage at the voltage terminal of the control circuit against the second reference source;
   a primary side turn-on determination unit configured to obtain an integral value of a current flowing into a time setting terminal of the control circuit and compare the integral value of the current against a pre-configured value;
   a secondary intermittent burst estimation unit configured to predict a time required for turning on a synchronous rectifier based on the integral value of the current obtained by the primary side turn-on determination unit, to provide a shielding time based on the predicted time for turning on the synchronous rectifier, and to compare the shielding time against an actual time for turning on the synchronous rectifier;
   a logic unit configured to generate logic control signals for turning the synchronous rectifier based on the comparison results from the turn-on comparator and the primary side turn-on determination unit, and logic control signals for turning off the synchronous rectifier based on the comparison results from the first turn-off comparator and the secondary side intermittent burst estimation unit; and
   a driver unit configured to drive the synchronous rectifier based on the logic control signals generated by the logic unit.

2. The isolated synchronous rectification control circuit of claim 1, wherein:
   the comparator module further includes a second turn-off comparator configured to compare the voltage at the voltage terminal of the control circuit against a third reference source generated by the reference module.

3. The isolated synchronous rectification control circuit of claim 1, further including:
   a clamp circuit configured to prevent erroneous turn-on of the synchronous rectifier.

4. The isolated synchronous rectification control circuit of claim 1, wherein:
   the primary side turn-on determination unit includes an integrating capacitor, a first current mirror composed of two NMOS transistors, a second current mirror composed of two PMOS transistors, a comparator unit, and a pull-down NMOS transistor;
   the reference module generates a first reference voltage;
   when the time setting terminal of the control circuit has a high voltage, the first current mirror is configured to produce a current to charge the integrating capacitor through the second current mirror;
   the comparator unit is configured to compare the voltage of the integrating capacitor against the first reference voltage and output a voltage signal based on the comparison result; and
   the pull-down NMOS transistor is configured to discharge the voltage of the integrating capacitor at the end of each turn-on period.

5. The isolated synchronous rectification control circuit of claim 1, wherein:
   the secondary side intermittent burst estimation unit circuit includes an NPN transistor, a third current mirror composed of two PMOS transistors, a fourth current mirror composed of two NMOS transistors, and a comparator unit;
   the reference module generates a second reference voltage;

the NPN transistor is configured to achieve clamping zero;

when the time setting terminal of the control circuit has a low voltage, the third current mirror is configured to produce a current to discharge the integrating capacitor through the fourth current mirror; and the comparator unit is configured to compare the voltage of the integrating capacitor against the second reference voltage and output a voltage signal based on the comparison result.

6. The isolated synchronous rectification control circuit of claim 1, wherein:

the power supply module includes a start-up circuit, a modulation resistor, a high voltage PMOS transistor, two voltage divider resistors, an operational amplifier circuit, and a high voltage NMOS transistor;

the start-up circuit is configured to produce a current when the voltage terminal of the control circuit has a high voltage;

the modulation resistor is configured to produce a voltage;

the high voltage PMOS transistor is configured to receive a voltage to be turned on; and when the voltage at the voltage terminal of the control circuit reaches a start-up voltage, the operational amplifier circuit is configured to compare the voltage of the two voltage divider resistors against the reference voltage, and control to turn off the high voltage NMOS transistor based on the comparison result.

7. The isolated synchronous rectification control circuit of claim 6, wherein:

the power supply module further includes a NPN transistor configured to prevent a backward current flow from the power supply terminal to the voltage terminal of the control circuit.

8. An isolated synchronous rectification control method, comprising:

setting a primary side turn-on time constant and obtaining an integral value of the current flowing into a synchronous rectification control circuit;

comparing the integral value of the current against a pre-configured value and controlling the turn-on of a synchronous rectifier based on a comparison result of a voltage of the synchronous rectification control circuit and a reference source;

predicting a time required for turning on the synchronous rectifier based on the integral value of the current and providing a shielding time based on the predicted time for turning on the synchronous rectifier;

when an actual time for turning on the synchronous rectifier exceeds the shielding time and the voltage of the synchronous rectification control circuit is greater than the reference source, controlling to turn off the synchronous rectifier.

9. The isolated synchronous rectification control method of claim 8, wherein:

the time required for turning on the synchronous rectifier is obtained by estimating a negative voltage difference between the time setting terminal and the output ground terminal of the synchronous rectification control circuit during the secondary side continuous current flow.

10. An isolated synchronous rectification control device, comprising:

an isolated synchronous rectification control circuit, including:

a power supply module, configured to supply a voltage;

a reference module, configured to generate at least a first and a second reference source;

a comparator module, including a turn-on comparator configured to compare a voltage at a voltage terminal of the control circuit against the first reference source and a first turn-off comparator configured to compare the voltage at the voltage terminal of the control circuit against the second reference source;

a primary side turn-on determination unit, configured to obtain an integral value of a current flowing into a time setting terminal of the control circuit and compare the integral value of the current against a pre-configured value;

a secondary intermittent burst estimation unit, configured to predict a time required for turning on a synchronous rectifier based on the integral value of the current obtained by the primary side turn-on determination unit, to provide a shielding time based on the predicted time for turning on the synchronous rectifier, and to compare the shielding time against an actual time for turning on the synchronous rectifier;

a logic unit, configured to generate logic control signals for turning the synchronous rectifier based on the comparison results from the turn-on comparator and the primary side turn-on determination unit, and logic control signals for turning off the synchronous rectifier based on the comparison results from the first turn-off comparator and the secondary side intermittent burst estimation unit; and a driver unit, configured to drive the synchronous rectifier based on the logic control signals generated by the logic unit; and a transformer, wherein:

one end of the secondary output winding is connected to a ground terminal of the synchronous rectification control circuit and a bypass capacitor; and the other end of the secondary output winding is connected to the ground;

a bypass capacitor connected to a power supply terminal of the synchronous rectification control circuit to provide a stable voltage for the synchronous rectification control circuit;

a time constant setting resistor connected to a time setting terminal of the synchronous rectification control circuit to configure a primary side turn-on time constant and a secondary intermittent burst time estimation determination; and an output capacitor connected to a voltage terminal of the rectification control circuit to provide an output capacitance.

11. The isolated synchronous rectification control device of claim 10, wherein:

the comparator module further includes a second turn-off comparator configured to compare the voltage at the voltage terminal of the control circuit against a third reference source generated by the reference module.

12. The isolated synchronous rectification control device of claim 10, further including:

a clamp circuit configured to prevent erroneous turn-on of the synchronous rectifier.

13. The isolated synchronous rectification control device of claim 10, wherein:

the primary side turn-on determination unit includes an integrating capacitor, a first current mirror composed of two NMOS transistors, a second current mirror composed of two PMOS transistors, a comparator unit, and a pull-down NMOS transistor;

the reference module generates a first reference voltage;

when the time setting terminal of the control circuit has a high voltage, the first current mirror is configured to produce a current to charge the integrating capacitor through the second current mirror;

the comparator unit is configured to compare the voltage of the integrating capacitor against the first reference voltage and output a voltage signal based on the comparison result; and the pull-down NMOS transistor is configured to discharge the voltage of the integrating capacitor at the end of each turn-on period.

14. The isolated synchronous rectification control device of claim 10, wherein:

the secondary side intermittent burst estimation unit circuit includes an NPN transistor, a third current mirror composed of two PMOS transistors, a fourth current mirror composed of two NMOS transistors, and a comparator unit;

the reference module generates a second reference voltage;

the NPN transistor is configured to achieve clamping zero;

when the time setting terminal of the control circuit has a low voltage, the third current mirror is configured to produce a current to discharge the integrating capacitor through the fourth current mirror; and the comparator unit is configured to compare the voltage of the integrating capacitor against the second reference voltage and output a voltage signal based on the comparison result.

15. The isolated synchronous rectification control device of claim 10, wherein:

the power supply module includes a start-up circuit, a modulation resistor, a high voltage PMOS transistor, two voltage divider resistors, an operational amplifier circuit, and a high voltage NMOS transistor;

the start-up circuit is configured to produce a current when the voltage terminal of the control circuit has a high voltage;

the modulation resistor is configured to produce a voltage;

the high voltage PMOS transistor is configured to receive a voltage to be turned on; and when the voltage at the voltage terminal of the control circuit reaches a start-up voltage, the operational amplifier circuit is configured to compare the voltage of the two voltage divider resistors against the reference voltage, and control to turn off the high voltage NMOS transistor based on the comparison result.

16. The isolated synchronous rectification control device of claim 15, wherein:

the power supply module further includes a NPN transistor configured to prevent a backward current flow from the power supply terminal to the voltage terminal of the control circuit.

* * * * *